United States Patent [19]

Marino, Jr. et al.

[11] Patent Number: 4,587,625
[45] Date of Patent: May 6, 1986

[54] PROCESSOR FOR SIMULATING DIGITAL STRUCTURES

[75] Inventors: Joseph T. Marino, Jr., Chandler; Ronald V. Chandos, Tempe, both of Ariz.

[73] Assignee: Motorola Inc., Schaumburg, Ill.

[21] Appl. No.: 510,717

[22] Filed: Jul. 5, 1983

[51] Int. Cl.$^4$ .................. G06F 15/16; G06F 15/60
[52] U.S. Cl. .................... 364/578; 364/900; 371/23
[58] Field of Search ............ 364/200, 900, 554, 578, 364/300; 371/23, 24, 25, 26

[56] References Cited

U.S. PATENT DOCUMENTS

| | | | |
|---|---|---|---|
| 3,961,250 | 6/1976 | Snethen | 371/25 X |
| 4,205,383 | 5/1980 | Bakanovich et al. | 364/554 |
| 4,306,286 | 12/1981 | Cocke et al. | 364/200 |
| 4,342,093 | 7/1982 | Miyoshi | 364/578 |
| 4,433,414 | 2/1984 | Carey | 371/25 X |
| 4,472,804 | 9/1984 | Fullwood et al. | 364/578 X |

*Primary Examiner*—Felix D. Gruber
*Attorney, Agent, or Firm*—Jonathan P. Meyer

[57] ABSTRACT

A hardware simulator for simulating digital structures includes a general purpose computer and an improved simulator processor. The improved processor handles an advanced primitive having four inputs and one output and which is capable of representing a memory cell or similar structure. The architecture of the processor provides highly efficient compilation of the input states of a primitive and the primitive evaluator and resolver logic provide the output state in a minimum number of clock cycles. The simulator is a single, low cost unit capable of simulating 64K cell structures with a speed comparable to prior art simulators.

25 Claims, 6 Drawing Figures

PROCESSOR FOR SIMULATING DIGITAL STRUCTURES

FIELD OF THE INVENTION

The present invention relates, in general, to processors for simulating and/or fault grading digital structures such as VLSI circuits. More particularly, the invention relates to a processor having an improved architecture which can economically perform simulation and fault grading of very large digital structures.

BACKGROUND OF THE INVENTION

During the design of very large digital structures, such as VLSI circuits comprising upwards of 100,000 transistors, it is crucial to have available relatively quick means for simulating the performance of a current version of the structure. In addition, it is sometimes necessary to perform rigorous fault grading of a proposed structure; that is, to accurately determine the effects of a particular failure within the structure. Hereinafter, all processes which seek to model the performance of a digital structure, such as simulation and fault grading, are referred to generically as simulation.

One approach to the problem is to devise a program to be run on a general purpose computer (hereinafter, a software simulator) which performs the simulation. Such software simulators are currently available, but would require several months to a year of dedicated CPU time to simulate a 100,000 transistor structure. This is obviously too long to be incorporated into a realistic design cycle.

The other approach is to design a special purpose processor (hereinafter, a hardware simulator) which is loaded by a host computer with a description of the structure to be simulated, which host computer subsequently receives the results of the simulation from the hardware processor.

An example of such a hardware processor is described in U.S. Pat. No. 4,306,286, issued to John Cocke et al. on Dec. 15, 1981. This device, designated a Logic Simulation Machine by its inventors, is a very large device comprising a plurality of highly parallel basic processors which are interconnected by means of a switch and a local computer, which is coupled to a mainframe host computer. In the described embodiment, each basic processor simulates 1K (1024) gates. Each gate, also referred to as a primitive, is the basic functional unit with which the structure is described and has 5 inputs and 1 output. While any digital structure can be simulated with very simple primitives (e.g. the Boolean Functions AND, OR and XOR), more primitives are required to describe a given structure if each is excessively simple. The Logic Simulation Machine invented by Cocke et al. requires the dedication of an extremely complicated and costly device comprising a mainframe computer, a minicomputer and the array of basic processors for days, weeks or months at a time to perform a single simulation. Therefore, a need exists for a hardware simulator capable of performing simulations of substantially the same magnitude as the Logic Simulation Machine, but at reduced cost.

SUMMARY OF THE INVENTION

Accordingly, it is an object of the present invention to provide an improved processor for simulating digital structures.

It is a further object to provide an improved hardware simulator.

Yet a further object of the present invention is to provide a hardware simulator utilizing an advanced primitive and an improved primitive evaluation architecture.

Still a further object of the invention is to provide a hardware simulator capable of handling very large digital structures utilizing a single processor.

A preferred embodiment of the present invention comprises a hardware simulator for use with a minicomputer host. The simulator comprises a single, special purpose processor which simulates a structure described in terms of an advanced primitive. The advanced primitive has four inputs and a single output and is capable of representing memory cells as well as simpler logic devices. In other words, the primitive evaluation process considers previous as well as present input states. The state of each location, or node, within the structure is represented by a three-bit word having five permitted values. A highly efficient primitive evaluation architecture and bus resolver logic determine the output state of a given primitive in a minimum number of clock cycles. The state memory of the processor includes the present and previous state of each node in the structure, allowing the evaluation of the advanced primitive. The structure description is contained in a writable control store, which provides state memory and primitive evaluator addresses as a program counter is stepped through the structure. The state memory utilizes a ping-pong architecture to avoid the necessity of ordering the structure to be simulated.

The preferred embodiment of the present invention is designed to simulate a structure comprising 64K advanced primitives, which corresponds to a circuit including up to approximately 250,000 transistors. The processor is intended to be loaded with the structure description and input vector by a dedicated mini-computer host, such as an EXORmacs ® development system, which receives the output vector at the conclusion of the simulation. The system described is intended to offer the level of performance similar to other hardware or software simulators at roughly one-tenth the cost, thus allowing the dedication of a single unit to a particular task for the long periods required to simulate very large digital structures.

These and other objects and advantages of the present invention will be apparent to one skilled in the art from the detailed description below taken together with the drawings.

DETAILED DESCRIPTION OF THE INVENTION

Digital structures which are to be simulated using the processor disclosed herein are described in terms of basic functional units referred to primitives. The advanced primitive around which the simulator processor according to the principles of the present invention is designed is a four-input, one-output device which has one possible internal history element. In other words, the advanced primitive is capable, by itself, of representing a flip flop or memory cell which would require two or more primitives without an internal history element. In the preferred embodiment of the present invention the structure of the simulator processor allows for 512 different primitive types with which to describe the digital structure to be simulated. The functional description of the various primitive types and the compilation of the description of the digital structure in terms of the primitives take place within a host computer system to which the simulator processor is connected. These processes are well within the knowledge of one skilled in the art of using hardware or software simulators and will not be discussed in detail herein.

Besides the primitives, the other structural features of the digital structure which are discussed herein are the nodes, or the locations within the digital structure the state of which is stored in state memory. In general, a node corresponds to the output of one or more primitives and to an input of one or more primitives. A node may also represent a point of input or output to the digital structure. As will be apparent from the description of the state memory architecture below, each node is identified by the processor by the number of the primitive at whose output the node is located.

In the preferred embodiment of the present invention the simulator processor is a five-state machine. In other words, it requires three bits to specify the state of any node in the digital structure. These three bits are referred to as the data bit, the Z bit and the X bit; or A0, A1 and A2, respectively. The five possible states which may be assumed by any node within the digital structure and the corresponding bit pattern are found in Table I. All bit patterns other than those found in Table I are prohibited.

TABLE I

| X BIT A2 | Z BIT A1 | DATA BIT A0 | VALUE | DESCRIPTION |
|---|---|---|---|---|
| 0 | 0 | 0 | "0" | Driven Low Level |
| 0 | 0 | 1 | "1" | Driven High Level |
| 0 | 1 | 0 | "Z0" | Undriven Low Level |
| 0 | 1 | 1 | "Z1" | Undriven High Level |
| 1 | 0 | 0 | "X" | Unknown Value |

Figure 1:
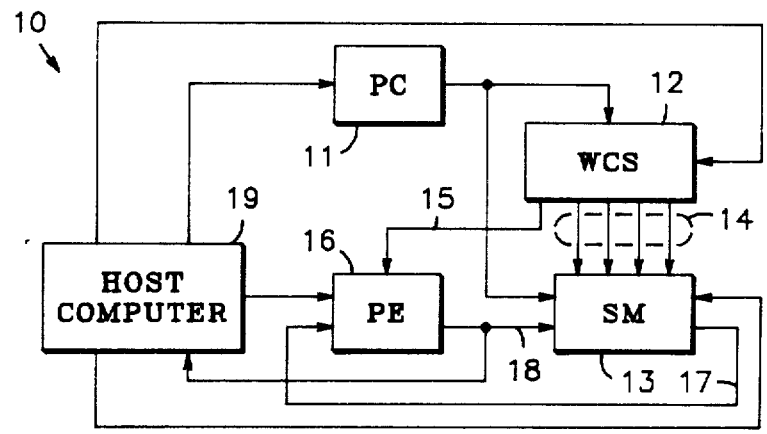
FIG. 1 is a block diagram of a processor useful for simulating digital structures according to the principles of the present invention.

Referring now to FIG. 1, a simulator processor 10 according to the principles of the present invention is shown in a simplified block diagram. A program counter (PC) 11 controls the running of the simulation by sequentially stepping through the primitives which are used to describe the digital structure. At each step, program counter 11 supplies a sequential address, or primitive number, to a writable control store (WCS) 12. Program counter 11 also supplies an evaluation write address to a state memory (SM) 13. The evaluation write address corresponds to the location in state memory 13 of the node which is at the output of the current primitive. In the preferred embodiment, nodes are identified by the number of the primitive at whose output the node appears. Thus, the evaluation write address, which locates the output node of the current primitive, is identical to the primitive number supplied to WCS 12. When writable control store 12 receives a new primitive number from program counter 11 it supplies, by means of lines 14, the read addresses for the locations in state memory 13 of the nodes which are at the inputs of the current primitive. Writable control store 12 also supplies, by means of line 15, a primitive type indicator to a primitive evaluator 16. Once state memory 13 has received the read addresses for the inputs of the current primitive from writable control store 12, it reads the current states of those nodes and communicates that information to primitive evaluator 16 via line 17. Since primitive evaluator 16 now has an indication of the type of the current primitive and the states of all of the inputs thereof, it can evaluate the current state of the output thereof. This is communicated to state memory 13 by means of line 18 and is written in the location specified by the evaluation write address.

As shown in FIG. 1, each of the major components of simulator processor 10 has an input channel from the host computer system 19. This allows the description of the digital structure to be entered prior to simulation along with the states of the input points of the structure. In addition, the host computer system 19 provides the functional descriptions of the various primitive types to be used in the simulation and may also provide for the alteration, or faulting, of various nodes in the structure. Further, host computer system 19 receives the output of primitive evaluator 16 as an input.

In the preferred embodiment of the present invention simulator processor 10 is designed to simulate digital structures which are described with up to 64K primitives. Thus, each of the lines which specify a particular primitive within the structure is a 16 bit line. Since 512 primitive types are to be accommodated, line 15, which carries a primitive type indicator, is a 9-bit line. As will be more apparent from the descriptions of the various elements of the simulator processor, the processor is basically a two cycle device. During one cycle the input states of a primitive are assembled by state memory 13. During the next cycle the primitive is evaluated. During both cycles the read addresses for the next primitive are being accessed in writable control store 12. Furthermore, the architecture of state memory 13 allows the result of the previous evaluation to be written while the inputs for the current primitive are being assembled. It is anticipated that a simulator processor according to the principles of the present invention will be capable of performing as many as four million complete primitive evaluations per second. Program counter 11 steps through each primitive in the structure repeatedly until the structure settles down or until an oscillation state is identified. It is anticipated that very large digital structures may be simulated in a matter of a few seconds.

Figure 2:
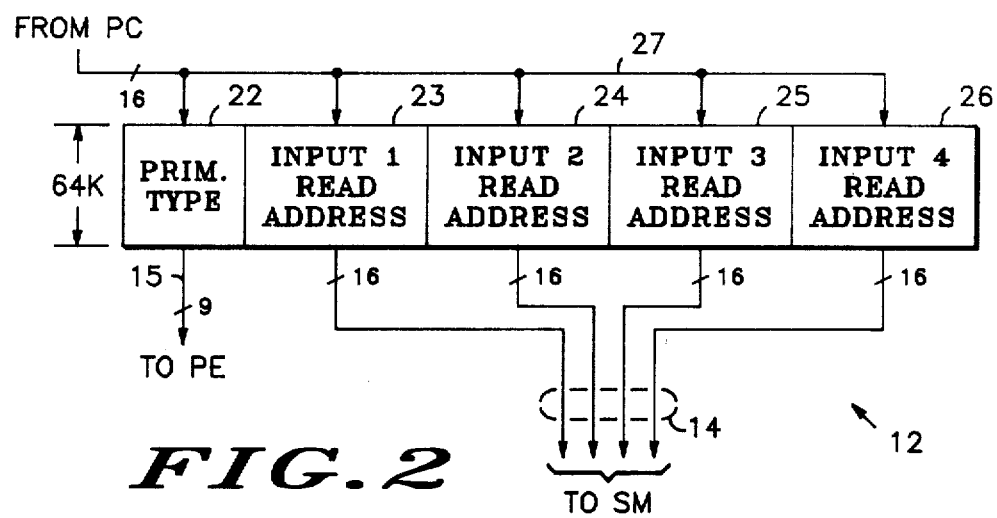
FIG. 2 is a detailed block diagram of a writable control store portion of a simulator processor according to the principles of the present invention.

Referring now to FIG. 2, writable control store 12 is shown in a detailed block diagram. Writable control store 12 comprises a primitive type block 22 and four input read address blocks 23, 24, 25 and 26. Each of the blocks 22–26 which make up writable control store 12 is a block of memory which is 64K bits deep. Primitive type block 22 is nine bits wide and each of the input read address blocks 23-26 is 16 bits wide. A 16-bit sequential address, or primitive number, line 27 couples the address input of each of the blocks 22-26 to the program counter. Each time the program counter steps to the next sequential primitive number primitive type block 22 puts an indicator of primitive type of the current primitive on 9-bit line 15. Each of the input read address blocks 23-26 puts a 16 bit address indicating the location in state memory of the node corresponding to that input of the current primitive on one of lines 14. In other words, input 1 read address block 23 provides the address in state memory at which the current state of the node corresponding to input 1 of the current primitive can be found. The input from the host computer system to writable control store 12, which is not shown in FIG. 2, simply provides a means for writing information to each of the memory locations in writable control store 12. As is apparent to one skilled in the art, writable control store 12 can be readily constructed from standard memory parts. Since the details of the construction will depend upon the particular parts chosen, they will not be discussed herein.

Figure 3:
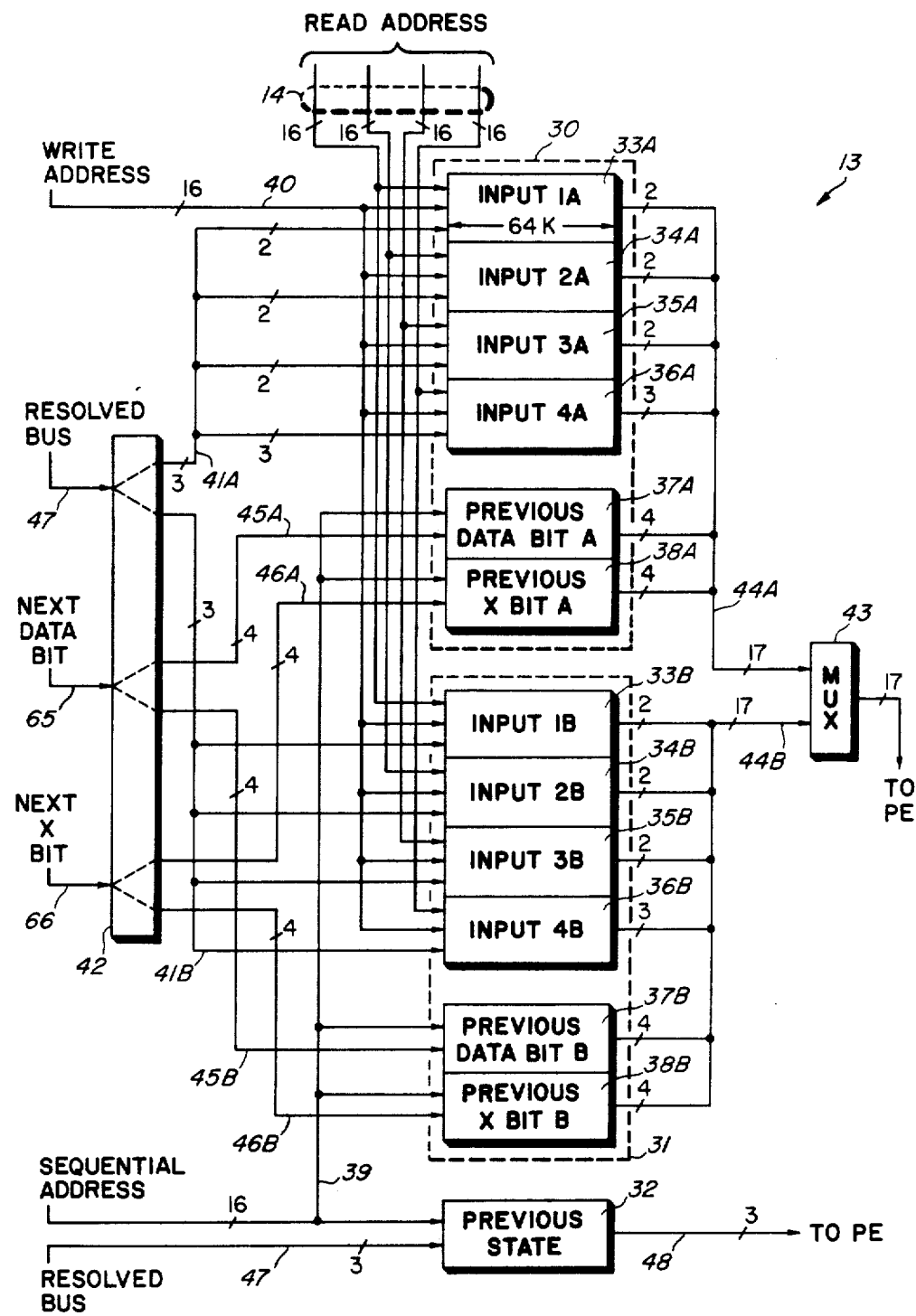
FIG. 3 is a detailed block diagram of a state memory portion of a simulator processor according to the principles of the present invention.

Referring now to FIG. 3, state memory 13 is shown in a detailed block diagram. State memory 13 primarily comprises an A portion 30, a B portion 31 and a previous state portion 32. As will be more apparent from the detailed discussion below, A portion 30 and B portion 31 contain the information regarding the states of the nodes at the inputs of the current primitive and regarding the history of the input states of the current primitive necessary for primitive evaluator 16 to resolve the output state of the current primitive. At the start of the simulation process, the required information is read from A portion 30. As each primitive is resolved, the output information is written into B portion 31. When each of the primitives has been evaluated once, the roles of the A and B portions are swapped and the evaluation of each primitive is repeated. This is referred to as a ping-pong memory management scheme. At each stage, the newly resolved output state of each primitive is compared to the previous state of that primitive as is stored in previous state portion 32. If an entire pass through each of the primitives is completed showing agreement between the previous and present states of each primitive, the simulation is declared complete. It is also possible to declare, after a predetermined number of passes through each of the primitives, that a state of oscillation exists in the digital structure being simulated.

The ping-pong memory management scheme is implemented by means of switch 42 and multiplexer 43. In other words, on one pass, multiplexer 43 selects the information read from A portion 30 to be passed to the primitive evaluator and switch 42 couples the results produced by primitive evaluator 16 to B block 31 to be written. On the next pass through the primitives, multiplexer 43 selects the information read from B portion 31 to be passed to primitive evaluator 16 and switch 42 couples the results to A portion 30 to be written.

In order for this scheme to work, the structure of A portion 30 and B portion 31 must be identical. Therefore, only A portion 30 will be described in detail.

A portion 30 comprises an input 1A block 33A, an input 2A block 34A, an input 3A block 35A, an input 4A block 36A, a previous data bit A block 37A and a previous X bit A block 38A. Input 1A block 33A is a block of memory 64K bits deep and two bits wide. It stores, at each of its 64K locations, the data bit and the X bit which specify the state of the node at the output of one of the primitives in the digital structure. Similarly, input 2A block 34A is a block of memory 64K bits deep and two bits wide and stores the data bits and X bits which specify the states of the nodes at the outputs of each of the primitives. Input 3A block 35A is a block of memory 64K bits deep and two bits wide and stores the data bits and the X bits which specify the states of the nodes at the outputs of each of the primitives. Finally, input 4A block 36A is a block of memory 64K bits deep and three bits wide and it stores the data bits, the Z bits and the X bits which specify the states of the nodes at the outputs of each of the primitives. It has been found that sufficient flexibility in specifying primitive function can be achieved with only one input of the primitive being specified with three bits. For simplicity, this is always defined as input 4, and the other inputs are specified using two bits.

Previous data bit A block 37A is a block of memory 64K bits deep and four bits wide and it stores the data bits from each of the four inputs of each primitive during the immediately preceding pass through the structure. Similarly, previous X bit A block 38A is a block of memory 64K bits deep and four bits wide and stores the X bit from each of the four inputs of each primitive during the immediately preceding pass through the structure.

During a pass in which A block 30 is being read from, the appropriate locations in input blocks 33A, 34A, 35A and 36A are selected by the addresses on lines 14 which were supplied by writable control store 12. In other words, the address supplied to input 1A block 33A identifies the primitive whose output is coupled to input 1 of the current primitive. In the case of blocks 37A and 38A, the information is addressed sequentially, or by primitive number. This is supplied by a sequential address line 39 which carries the 16-bit primitive number of the current primitive.

Once the individual data blocks in A portion 30 have been supplied with the appropriate addresses, the 17 bits which make up the combined outputs of the individual blocks are placed on line 44A which couples A portion 30 to multiplexer 43. Since A portion 30 is being read from during this pass, multiplexer 43 will select the 17 bits on line 44A to be passed to the primitive evaluator.

During a pass in which A portion 30 is being written to, the address which specifies the location at which the results of the evaluation of the current primitive are to be written is supplied to blocks 33A, 34A, 35A and 36A by write address line 40. As was discussed above, the address on line 40 is identical to the sequential address, or primitive number, on line 39. The resolved state of the output of the current primitive is coupled to switch 42 from primitive evaluator 16 via resolved bus 47. Since A portion 30 is being written to in this pass, switch 42 couples the 3-bit output state to line 41A. This information is written into blocks 33A, 34A, 35A and 36A at the location specified by line 40. In the case of blocks 33A, 34A and 35A, only the data bit and X bit are written. Similarly, the data bits which appeared at each of the inputs of the current primitive during the current evaluation pass are coupled from primitive evaluator 16 through switch 42 and line 45A to be written in previous data bit A block 37A at the address specified by line 39. The X bits appearing at each of the four inputs of the current primitive during the current pass are coupled from primitive evaluator 16 through switch 42 and line 46A to previous X bit A block 38A to be written in the location specified by line 39. As is apparent, by the time this information is read during the next evaluation pass, it will be the previous bit information which is required.

The resolved state of the output of the current primitive is coupled from primitive evaluator 16 to previous state portion 32 by means of resolved bus 47 and is written in the location specified by sequential address line 39. When program counter 11 steps to a new primitive number, this will appear on sequential address line 39 and the previous output state of the current primitive will be read from previous state portion 32 and passed to primitive evaluator 16 via line 48. As is apparent, previous state portion 32 is a block of memory which is 64K bits long and three bits wide.

As will be apparent to one skilled in the art from the detailed description of the architecture of state memory 13, the addresses which must be supplied by writable control store 12 via lines 14 are simply the sequential primitive numbers of the primitives whose outputs are coupled to the four inputs of the current primitive. In other words, if primitive number M has input 1 coupled to the output of primitive number N, then block 23 of writable control store 12 supplies the 16 bit equivalent of the number N to input 1A block 33A of state memory 13 when program counter 11 advances to primitive number M. As was discussed above, the appropriate addresses were loaded into writeable control store 12 via the link to the host computer system.

FIG. 3 omits the link between state memory 13 and the host computer system. As is apparent, this link allows the host computer system to determine the contents of state memory 13 prior to starting a simulation. The generation of an input vector, which specifies the states of the input points of the digital structure, and the loading of the input vector into state memory 13 are accomplished on the host computer system.

Figure 4:
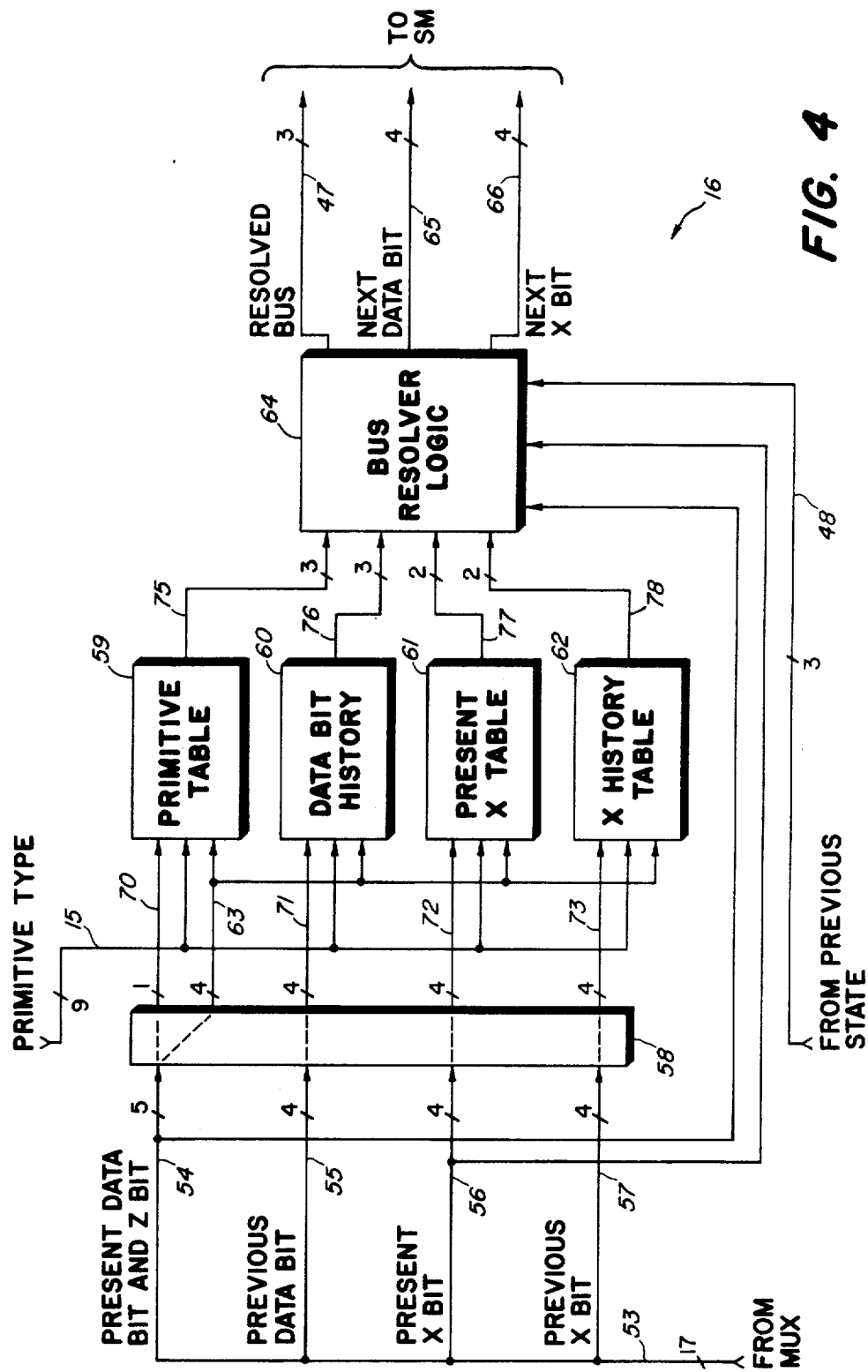
FIG. 4 is a detailed block diagram of a primitive evaluator portion of a simulator processor according to the principles of the present invention.

Referring now to FIG. 4, primitive evaluator 16 is shown in a detailed block diagram. A 17-bit line 53 from multiplexer 43 of state memory 13 is split into four lines 54, 55, 56 and 57. Line 54 is a 5-bit line carrying the present data bit from each of the four inputs to the current primitive and the Z bit from input 4 of the current primitive. Line 55 is a 4-bit line carrying the data bits from all four inputs of the current primitive during the immediately preceding pass through the structure. Line 56 is a 4-bit line carrying the present X bits from all four inputs of the current primitive. Line 57 is a 4-bit line carrying all four X bits from the input of the current primitive during the immediately preceding pass through the structure. Lines 54, 55, 56 and 57 are coupled to an input bus controller 58.

Input bus controller 58 is used to artificially control the inputs to primitive evaluator 16 under control of the host computer system, regardless of the information stored in state memory 13. For instance, during the first pass through the structure, input bus controller 58 may be used to generate unknown states, or X states, in all locations except those occupied by the input vector. This may be more efficient than storing X states in all locations in state memory 13 prior to starting the simulation. More importantly, input bus controller 58 may be used to introduce faults into the digital structure at any given point during the simulation for fault grade purposes.

The next stage of primitive evaluator 16 comprises a primitive table 59, a data bit history table 60, a present X table 61 and an X history table 62. Each of the tables 59, 60, 61 and 62 is actually 512 tables corresponding to the 512 available primitive types. To evaluate each primitive, the correct one of each of the tables is selected by the 9-bit primitive type indicator on line 15, which is coupled to each table. In addition, a line 63 from input bus controller 58 carrying the four data bits which presently appear at the inputs of the current primitive is coupled to each of the tables 59, 60, 61 and 62.

Tables 59, 60, 61 and 62 are used to answer four questions regarding the current and previous states of the primitive inputs. The answers to these questions depend upon the functional description of the particular primitive type. The answers can be used to unambiguously determine the current output state of the primitive. This architecture represents a significant advance in the evaluation efficiency of hardware simulators.

The four questions to be answered are: (1) is the primitive leaving an X condition; (2) does the primitive presently have an X condition at an input; (3) has the primitive transitioned properly; and (4) what is the new result. These questions are answered by X history table 62, present X table 61, data bit history table 60 and primitive table 59, respectively. The details of the evaluation process are discussed more fully below.

Primitive table 59 is input with the Z bit from input 4 of the current primitive by means of line 70 from input bus controller 58. Data bit history table 60 is input with the four previous data bits from the inputs of the primitive by means of line 71 from input bus controller 58. Present X table 61 is input with the four present X bits from the inputs from the primitive by means of line 72 from input bus controller 58. X history table 62 is input with the four previous X bits from the inputs of the primitive by means of line 73 from input bus controller 58. The outputs of tables 59, 60, 61 and 62 are coupled by means of lines 75, 76, 77 and 78, respectively, to bus resolver logic 64. Bus resolver logic 64 also has inputs coupled to line 48 from previous state memory portion 32 of state memory 13, to present X bit line 56 and to the four present data bits on line 54. According to a process discussed fully below, bus resolver logic 64 determines the current output state of the current primitive and passes the result by means of line 47 to state memory 13. It also passes the four present data bits by means of line 65 to be stored in previous data bit memory. Also, the four present X bits are passed via line 66 to be stored in previous X bit memory.

The first question, whether or not the primitive is leaving an X condition at one of its inputs, is answered by addressing X history table 62 with the previous X bits and the present data bits. Depending on the functional definition of the current primitive and its inputs, X history table 62 produces a two-bit output the definition of which is described in Table II.

TABLE II

| TABLE OUTPUT | DEFINITION |
| --- | --- |
| 00 | No Action |
| 01 | Conditional X |
| 10 | Absolute X |

It should be noted that X history table 62 is only defined for proper operation when no present X conditions exist. As will be described later, bus resolver logic 64 detects present X conditions and, if appropriate, ignores the output of X history table 62.

The second question, whether the primitive presently has an X condition at an input, is answered by addressing present X table 61 with the present data bits and the present X bits. Present X table 61 produces a two-bit output the definition of which is contained in Table II, above.

The third question, whether the primitive has transitioned properly, is answered by addressing data bit history table 60 with the present data bits and the previous data bits. Data bit history table produces a three-bit output, of which two bits are defined according to Table III.

TABLE III

| TABLE OUTPUT | DEFINITION |
| --- | --- |
| 00 | No Action |
| 01 | Q-1 |
| 10 | Absolute X |

The third bit output by data bit history table 60 is used in implementing the conditional X function of the evaluator. This function will be described below in the discussion of bus resolver logic 64.

The fourth question, what is the new result, is answered by addressing primitive table 59 with the present data bits and the single Z bit from input 4. Primitive table 59 produces a three-bit output which is defined as shown in Table IV.

TABLE IV

| TABLE OUTPUT | DEFINITION |
| --- | --- |
| 000 | "0" |
| 001 | "1" |
| 010 | "Z0" |
| 011 | "Z1" |
| 100 | Absolute X |

Figure 5:
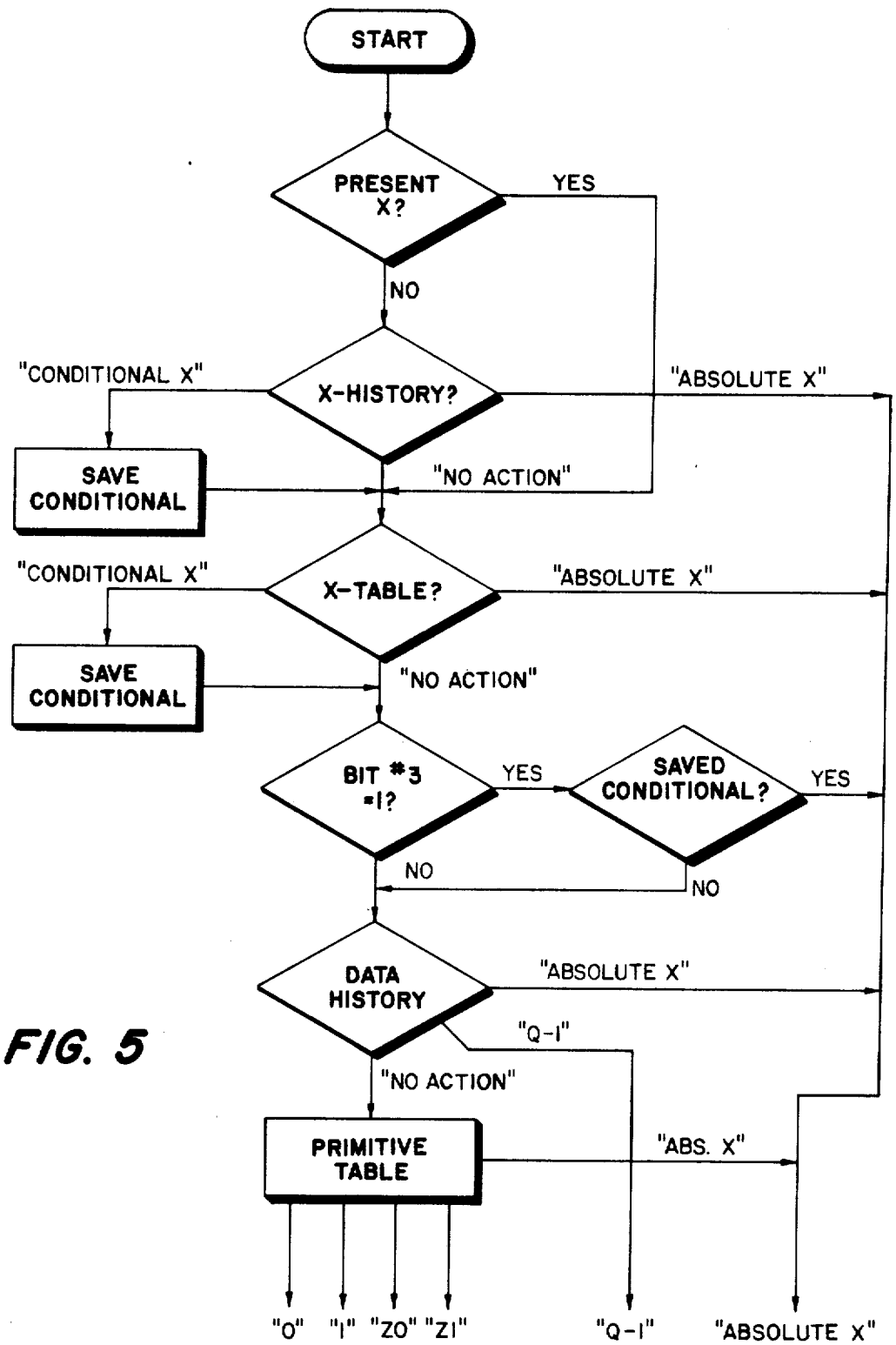
FIG. 5 is a flowchart describing the resolution function of the bus resolver portion of the primitive evaluator of FIG. 4.

In addition to several other functions described below, bus resolver logic 64 is responsible for receiving the outputs of tables 59, 60, 61 and 62 and resolving the current output state of the current primitive therefrom. The logical process by which this result is achieved is described with reference to FIG. 5. First, bus resolver logic 64 determines, from the contents of present X bit line 56, whether there is presently an X condition at one of the inputs of the primitive. If the answer is yes, this indicates that the output of X history table 62 is not necessarily correct and bus resolver logic 64 branches around its consideration of the output of X history table 62. If there is no X condition presently occurring, bus resolver logic 64 proceeds to consider the output of X history table 62. If the output is absolute X, as defined in Table II, then the output state of the current primitive is resolved to be X and resolver logic 64 outputs on resolved bus 47 the three-bit code corresponding to an X state as defined in Table I. If the output of X history table 62 is conditional X, then a "save conditional" operation is performed and bus resolver logic proceeds to the consideration of the output of present X table 61. If the output of X history table 62 is no action, then the consideration of the output of present X table 61 begins immediately.

The result of an absolute X output from present X table 61 is the same as that described above for X history table 62. Similarly, the result of a conditional X output from present X table 61 is the same as that described above for X history table 62. Finally, the result of a no-action output from present X table 61 is that the consideration of the output of data bit history table 60 proceeds.

First, bus resolver logic 64 checks to see if the third bit produced by data bit history table 60 is set to 1, indicating that previous conditional X results should be acted upon. If bit #3 is equal to one, then a check for previously saved conditional X results is made. If one is found, then an absolute X result is given and the evaluation is terminated. If either of the checks results in a negative answer, then the remainder of data bit history table output is considered.

Again, the result of an absolute X output from data bit history table 60 is the same as that described above. If the output of data bit history table 60 is Q-1, then bus resolver logic 64 resolves the current output state of the primitive to be identical to the previous output state of that primitive and simply transfers the three-bit code on line 48 to resolved bus 47. The result of a no-action output from data bit history table 60 is that the consideration of the output of primitive table 59 proceeds. During the consideration of data bit history table 60, bus resolver logic must consider the value of the third bit, or conditional X bit, produced by data bit history table 60.

Finally, unless an absolute X or Q-1 result has been achieved previously, bus resolver logic 64 proceeds to consider the output of primitive table 59. Primitive table 59 can produce an absolute X output, whose result is the same as was described above. In addition, primitive table 59 can produce the "0", "1", "Z0" and "Z1" results, in which case the appropriate three-bit codes are placed on resolved bus 47.

The above described function of the tables and the bus resolver logic will be more clear from the detailed example given below. In addition to this function, bus resolver logic 64 is responsible for comparing the newly resolved output state of the current primitive to the previously resolved state which is present on line 48. If an entire pass through the structure as defined by the primitives results in complete agreement between the current and previous states of each of the primitives, then the simulation is declared complete. It is also possible to define an oscillation condition in which a predetermined number of passes through the structure are completed without achieving a settled condition. Through its link to the host computer system, bus resolver logic 64 can be used to insert faults in the system in much the same way as input bus controller 58.

In order to more fully understand the function of the primative evaluator of FIG. 4, the reader is referred to FIG. 6 and the tables below. These will be used in describing the manner in which the primitive evaluator of FIG. 4 operates during the simulation of a flip-flop circuit. A flip-flop is chosen because it is a relatively complex device from the standpoint of a simulator. For instance, typical prior art simulators using simple primitives require 10 primitives to simulate one flip-flop, whereas a single advanced primitive according to the principles of the present invention is sufficient. For purposes of simplifying the example, the flip-flop is assumed to have only data (D) and clock (C) inputs. The single output is designated Q. In the example illustrated, only the data and X bits must be considered in performing the evaluation. A subscript X on either the D or C indicates that the X bit of that particular input is given in that column of the table. Similarly, a superscript -1 indicates that the previous, as opposed to the present, bits are in that column. In the timing diagram of FIG. 6, an X state is arbitrarily shown to have a level lying between the 1 level and 0 level.

Figure 6:
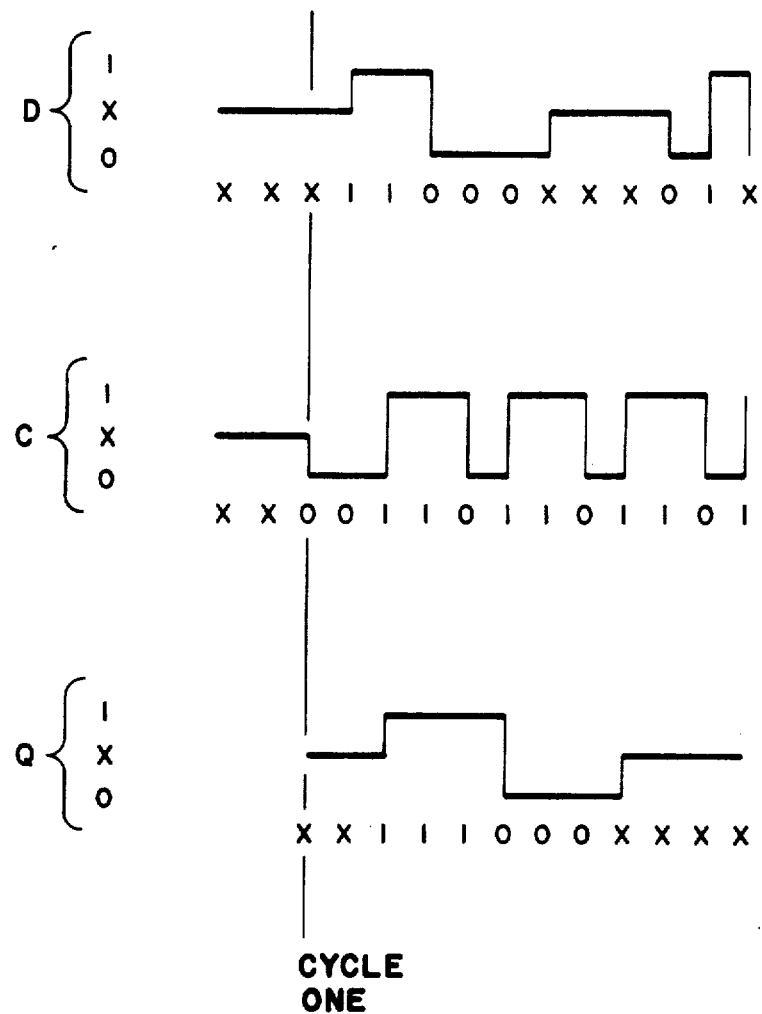
FIG. 6 is a timing diagram used to describe the simulation of a two input flip-flop.

To follow the simulation example, find the current input states of the flip-flop by referring to FIG. 6. Follow the process defined by the flowchart of FIG. 5 by referring to the X history table, the present X table, the data bit history table and the primitive table shown below. The entire simulation is summarized in the simulation table below.

As would be the case in an actual simulation, the present and past states of both the D and C inputs are defined to be X states prior to the beginning of the simulation as shown in FIG. 6. On the first evaluation cycle the D input remains in an X state and the C input is in a 0 state. Following the flow chart of FIG. 5, it is apparent that the X history table will be by-passed due to the presence of an X state at the D input. Next, the output of the present X table is considered. Since the D input is in an X state, the X bit is equal to 1 and the data bit is equal to 0. Since the C input is in a 0 state, the X bit is equal to 0 and the data bit is equal to 0. This provides the location in the present X table, which is designated (1000), at which the output of the present X table can be found. As indicated, that output is no action (NA).

Thus, the data bit history table is considered next. Since both inputs were previously in an X state, the previous data bits are both equal to 0. Again, the current data bits are 0 and 0. Thus, the output of the data bit history table is Q-1. This indicates that the previous output state is to be used as the present output state. Since the previous output state is undefined, the present output state is X. The fact that bit number 3 produced by the data bit history table is equal to 1 is not considered, since no conditional X's were produced earlier. Since a Q-1 result was reached in the data bit history table, the primitive table is not consulted.

This cycle is summarized in the first line of the simulation table which follows the primitive table below. This shows that the X history table was by-passed, the present X table was consulted at line (1000), the data bit history table was consulted at line (0000), the primitive table was by-passed and the resolved state was X.

By following through the timing diagram of FIG. 6 and the tables below, the operation of the primitive evaluator of FIG. 4 while evaluating a relatively complex advanced primitive type can be readily understood. From this understanding one skilled in the art can generate the primitive tables needed to use the simulator described above with a wide range of primitive types. It is possible, for instance, to simulate simple gates, latches, flip-flops, RAM cells and ROM cells. The latter will occupy a large portion of the available space for storing primitive types. For instance, an 8-bit by 1-bit ROM cell requires 256 primitive types to account for each of the possible states of that cell.

Several items of note in the simulation table should be pointed out. For instance, at cycle 7 a conditional X result is received from the present X table. This is a result of the fact that the present D input is in an X state. However, the data bit history table produces a Q-1 output together with a third bit of 0. Since the third bit was not equal to 1, the conditional X is ignored and the resolved state is "0". At cycle 9 a conditional X is again produced by the present X table and the data bit history table produces a no action coupled with a third bit of 1. This third bit value triggers the activation of the conditional X and results in an absolute X output.

| X HISTORY TABLE ||||| 
|---|---|---|---|---|
| $D_X^{-1}$ | $C_X^{-1}$ | D | C | OUTPUT |
| 0 | 0 | 0 | 0 | NA |
| 0 | 0 | 0 | 1 | NA |
| 0 | 0 | 1 | 0 | NA |
| 0 | 0 | 1 | 1 | NA |
| 0 | 1 | 0 | 0 | NA |
| 0 | 1 | 0 | 1 | ABS. X |
| 0 | 1 | 1 | 0 | NA |
| 0 | 1 | 1 | 1 | ABS. X |
| 1 | 0 | 0 | 0 | NA |
| 1 | 0 | 0 | 1 | COND. X |
| 1 | 0 | 1 | 0 | NA |
| 1 | 0 | 1 | 1 | NA |
| 1 | 1 | 0 | 0 | ABS. X |
| 1 | 1 | 0 | 1 | ABS. X |
| 1 | 1 | 1 | 0 | ABS. X |
| 1 | 1 | 1 | 1 | ABS. X |

| | PRESENT X TABLE |||||
|---|---|---|---|---|---|
| | $D_X$ | $C_X$ | D | C | OUTPUT |
| CYCLE #1 | 0 | 0 | 0 | 0 | NA |
| | 0 | 0 | 0 | 1 | NA |
| | 0 | 0 | 1 | 0 | NA |
| | 0 | 0 | 1 | 1 | NA |
| | 0 | 1 | 0 | 0 | COND. X |
| | 0 | 1 | 0 | 1 | — |
| | 0 | 1 | 1 | 0 | COND. X |
| | 0 | 1 | 1 | 1 | — |
| | 1 | 0 | 0 | 0 | NA |
| | 1 | 0 | 0 | 1 | COND. X |
| | 1 | 0 | 1 | 0 | — |
| | 1 | 0 | 1 | 1 | — |
| | 1 | 1 | 0 | 0 | ABS. X |
| | 1 | 1 | 0 | 1 | — |
| | 1 | 1 | 1 | 0 | — |
| | 1 | 1 | 1 | 1 | — |

| | DATA BIT HISTORY TABLE ||||||
|---|---|---|---|---|---|---|
| | $D^{-1}$ | $C^{-1}$ | D | C | OUTPUT | Bit #3 |
| CYCLE #1 | 0 | 0 | 0 | 0 | Q-1 | 1 |
| | 0 | 0 | 0 | 1 | NA | 1 |
| | 0 | 0 | 1 | 0 | Q-1 | 0 |
| | 0 | 0 | 1 | 1 | ABS. X | 0 |
| | 0 | 1 | 0 | 0 | Q-1 | 0 |
| | 0 | 1 | 0 | 1 | A-1 | 0 |
| | 0 | 1 | 1 | 0 | ABS. X | 0 |
| | 0 | 1 | 1 | 1 | Q-1 | 0 |
| | 1 | 0 | 0 | 0 | Q-1 | 0 |
| | 1 | 0 | 0 | 1 | ABS. X | 0 |
| | 1 | 0 | 1 | 0 | Q-1 | 1 |
| | 1 | 0 | 1 | 1 | NA | 0 |
| | 1 | 1 | 0 | 0 | Q-1 | 0 |
| | 1 | 1 | 0 | 1 | Q-1 | 0 |
| | 1 | 1 | 1 | 0 | Q-1 | 0 |
| | 1 | 1 | 1 | 1 | Q-1 | 0 |

| PRIMITIVE TABLE |||
|---|---|---|
| D | C | OUTPUT |
| 0 | 0 | — |
| 0 | 1 | "0" |
| 1 | 0 | — |
| 1 | 1 | "1" |

| SIMULATION TABLE | | | | | |
| --- | --- | --- | --- | --- | --- |
| CYCLE | X HIST. TABLE | PRES. X TABLE | DATA HIST. TABLE | PRIM. TABLE | RES. ST. |
| 1 | — | (1000) NA | (0000) Q-1 | — | X |
| 2 | (1010) NA | (0010) NA | (0010) Q-1 | — | X |
| 3 | (0011) NA | (0011) NA | (1011) NA | (11)"1" | "1" |
| 4 | (0001) NA | (0001) NA | (1101) Q-1 | — | "1" |
| 5 | (0000) NA | (0000) NA | (0100) Q-1 | — | "1" |
| 6 | (0001) NA | (0001) NA | (0001) NA | (01)"0" | "0" |
| 7 | — | (1001) COND X | (0101) Q-1 0 | — | "0" |
| 8 | — | (1000) NA | (0101) Q-1 | — | "0" |
| 9 | — | (1001) COND X | (0001) NA 1 | — | X |
| 10 | (1001) COND X | (0001) NA | (0101) Q-1 0 | — | X |
| 11 | (0010) NA | (0010) NA | (0110) ABS X | — | X |
| 12 | — | (1001) COND X | (1001) ABS X | — | X |

We claim:

1. A processor for simulating a digital structure comprising:
   first memory means for storing a description of said digital structure in terms of a list of primitives and interconnections therebetween;
   second memory means for storing present and previous state data, said second memory means being coupled to said first memory means to receive at least one input state read address therefrom corresponding to a current primitive;
   primitive evaluator means coupled to said second memory means to receive at least one input state therefrom and to said first memory means to receive a primitive type indicator therefrom, said primitive evaluator means producing a plurality of evaluator outputs;
   resolver logic means coupled to said primitive evaluator to receive said evaluator outputs therefrom for producing an output state of said current primitive, said resolver logic means being coupled to said second memory means to provide said output state thereto; and
   program counter means coupled to said first and second memory means for sequentially stepping through said list of primitives and, for each primitive, to provide a primitive number to said first memory means and an output state write address to said second memory means.

2. A processor according to claim 1 wherein the state of each location in said structure is represented by a three bit word having five permitted values, said three bits comprising a data bit, a Z-bit and an X-bit, and wherein said primitive evaluator means further comprises:
   means for determining if a present or previous input of said current primitive was undefined;
   means for determining if said data bit of an input of said current primitive has undergone a valid transition; and
   means for determining a partial output state of said current primitive.

3. A processor according to claim 1 wherein said first memory means comprises:
   a memory array having a number of records equal to a maximum number of primitives to be simulated, each said record storing a primitive type indicator and at least one address corresponding to a location in said second memory means at which input states are stored.

4. A processor according to claim 1 wherein said second memory means comprises:
   a first portion having a first number of blocks storing present states of locations in said structure and a second number of blocks storing previous states of locations in said structure;
   a second portion identical to said first portion;
   a third portion storing previous output states of said primitives; and
   means for selectably writing to one of said first and second portions and reading from the other of said portions.

5. A processor according to claim 2 wherein said means for determining if a present or previous input of said current primitive was undefined further comprises:
   first table means for receiving a present data bit and a previous X-bit from each input of said current primitive and for producing one of a no action, a conditional X and an absolute X response thereto; and
   second table means for receiving a present data bit and a present X-bit from each input of said current primitive and for producing one of a no action, a conditional X and an absolute X response thereto.

6. A processor according to claim 2 wherein said means for determining if said data bit of an input of said current primitive has undergone a valid transition further comprises:
   third table means for receiving a present data bit and a previous data bit from each input of said current primitive and for producing one of a no action, an immediate previous state output and an absolute X response thereto, said third table means also producing a conditional X activating output.

7. A processor according to claim 2 wherein said means for determining a partial output state of said current primitive further comprises:
   fourth table means for receiving a present data bit from each input of said current primitive and a present Z-bit from one input of said current primitive and for producing one of a hard 0, a hard 1, an undriven 0, an undriven 1 and an absolute X response thereto.

8. A processor according to claim 1 wherein the state of each location in said structure is represented by a three bit word having five permitted values, said three bits comprising a data bit, a Z-bit and an X-bit, and wherein said primitive evaluator further comprises:
   first table means for receiving a present data bit and a previous X-bit from each input of said current primitive and for producing one of a no action, a conditional X and an absolute X response thereto;
   second table means for receiving a present data bit and a present X-bit from each input of said current primitive and for producing one of a no action, a conditional X and an absolute X response thereto;
   third table means for receiving a present data bit and a previous data bit from each input of said current primitive and for producing one of a no action, an immediate output and an absolute X response thereto, said third table means also producing a conditional X activating output; and fourth table means for receiving a present data bit from each input of said current primitive and a present Z-bit from one input of said current primitive and for producing one of a hard 0, a hard 1, an undriven 0, an undriven 1 and an absolute X response thereto.

9. A processor according to claim 8 wherein said second memory means further comprises:

a first portion having a first number of blocks storing present states of locations in said structure and a second number of blocks storing previous states of locations in said structure;

a second portion identical to said first portion;

a third portion storing previous output states of said primitives; and means for selectably writing to one of said first and second portions and reading from the other of said portions.

10. A system for simulating digital structures comprising:

host computer means for creating a description of a digital structure in terms of an advanced primitive and for creating input vectors;

first memory means for storing said description;

second memory means for storing present and previous state data, said second memory means being coupled to said first memory means to receive at least one input state read address therefrom corresponding to a current primitive, said second memory means storing said input vectors;

primitive evaluator means coupled to said second memory means to receive at least one input state therefrom and to said first memory means to receive a primitive type indicator therefrom, said primitive evaluator means producing a plurality of evaluator outputs;

resolver logic means coupled to said primitive evaluator means to receive said evaluator outputs therefrom for producing an output state of said current primitive, said resolver logic means being coupled to said second memory means to provide said output state thereto; and program counter means coupled to said first and second memory means to provide a primitive number to said first memory means and an output state write address to said second memory means, said program counter being under the control of said host computer means.

11. A system according to claim 10 wherein the state of each location in said structure is represented by a three bit word having five permitted values, said three bits comprising a data bit, a Z-bit and an X-bit, and wherein said primitive evaluator means further comprises:

means for determining if a present or previous input of said current primitive was undefined;

means for determining if said data bit of an input of said current primitive has undergone a valid transition; and means for determining a partial output state of said current primitive.

12. A system according to claim 10 wherein said first memory means comprises:

a memory array having a number of records equal to a maximum number of primitives to be simulated, each said record storing a primitive type indicator and at least one address corresponding to a location in said second memory means at which input states are stored.

13. A system according to claim 10 wherein said second memory means comprises:

a first portion having a first number of blocks and a second number of blocks, each of said first number of blocks storing at least partial present state data corresponding to each location in said structure and each of said second blocks storing at least partial previous input state data corresponding to each primitive in said structure;

a second portion identical to said first portion;

a third portion storing previous state data for each primitive in said structure; and means for selectably writing to one of said first and second portions and for reading from the other of said first and second portions.

14. A system according to claim 11 wherein said means for determining if a present or previous input of said current primitive was undefined further comprises:

first table means for receiving a present data bit and a previous X-bit from each input of said current primitive and for producing one of a no action, a conditional X and an absolute X response thereto; and second table means for receiving a present data bit and a present X-bit from each input of said current primitive and for producing one of a no action, a conditional X and an absolute X response thereto.

15. A system according to claim 11 wherein said means for determining if said data bit of an input of said current primitive has undergone a valid transition further comprises:

third table means for receiving a present data bit and a previous data bit from each input of said current primitive and for producing one of a no action, an immediate output and an absolute X response thereto, said third table means also producing a conditional X activating output.

16. A system according to claim 11 wherein said means for determining a partial output state of said current primitive further comprises:

fourth table means for receiving a present data bit from each input of said current primitive and a present Z-bit from at least one input thereof and for producing one of a hard 0, a hard 1, an undriven 0, an undriven 1 and an absolute X response thereto.

17. A system according to claim 10 wherein the state of each location in said structure is represented by a three bit word having five permitted values, said three bits comprising a data bit, a Z-bit and an X-bit, and wherein said primitive evaluator further comprises:

first table means for receiving a present data bit and a previous X-bit from each input of said current primitive and for producing one of a no action, a conditional X and an absolute X response thereto;

second table means for receiving a present data bit and a present X-bit from each input of said current primitive and for producing one of a no action, a conditional X and an absolute X response thereto;

third table means for receiving a present data bit and a previous data bit from each input of said current primitive and for producing one of a no action, an immediate output and an absolute X response thereto said third table means also producing a conditional X activating output; and fourth table means for receiving a present data bit from each input of said current primitive and a Z-bit from at least one input thereof and for producing one of a hard 0, a hard 1, an undriven 0, an undriven 1 and an absolute X response thereto.

18. A system according to claim 17 wherein said second memory means further comprises:

a first portion having a first number of blocks and a second number of blocks, each of said first number of blocks storing at least partial present state data corresponding to each location in said structure and each of said second blocks storing at least partial previous input state data corresponding to each primitive in said structure;

a second portion identical to said first portion;

a third portion storing previous state data for each primitive in said structure; and means for selectably writing to one of said first and second portions and for reading from the other of said first and second portions.

19. In a simulation processor, a primitive evaluator comprising:

first table means for receiving a primitive type indicator, previous X bits and present data bits from each input of a primitive and for producing an output;

second table means for receiving a primitive type indicator, present X bits and present data bits from each input of said primitive and for producing an output;

third table means for receiving a primitive type indicator, previous data bits and present data bits from each input of said primitive and for producing an output;

fourth table means for receiving a primitive type indicator, present data bits from each input and Z bits from at least one input of said primitive and for producing an output; and logic means coupled to each of said table means for receiving said outputs and determining a present output state of said primitive.

20. A primitive evaluator according to claim 19 wherein:

said logic means further receives a previous output state of said primitive and compares said present and previous output states.

21. A method of simulating a digital structure comprising the steps of:

loading a first memory with a description of said digital structure in terms of a list of primitives and interconnections therebetween;

loading a second memory with indicators of the present and previous logic states of each of the inputs of each of said primitives; and sequentially stepping through said list of primitives and, for each step in said sequence:

supplying a primitive evaluator with a primitive type indicator for a current primitive from said first memory;

supplying said primitive evaluator with the present and previous logic states of each of the inputs of said current primitive from said second memory;

operating said primitive evaluator to determine a next output logic state of said current primitive: and loading said next output logic state of said current primitive into said second memory.

22. A method according to claim 21 further comprising the step of:

continuing to sequentially step through said list of primitives until either said present and previous logic states of each of said inputs of each of said primitives fails to change from one pass through said list to the next or until a race condition is identified.

23. A method according to claim 21 wherein said step of operating said primitive evaluator further comprises the steps of:

examining previous X bits and present data bits of said inputs and producing one of a no action, a conditional X and an absolute X response thereto;

examining present X bits and present data bits of said inputs and producing one of a no action, a conditional X and an absolute X response thereto;

examining previous data bits and present data bits of said inputs and producing one of a no action, an output previous state and an absolute X response thereto and also producing an activate conditional response; and examining present data bits and at least one present Z bit of said inputs and producing one of a "0", a "1", a "Z1", a "Z0" and an absolute X response thereto.

24. A method according to claim 23 further comprising the step of:

skipping said examination of said previous X bits and present data bits if a present X bit is equal to one.

25. A method according to claim 23 further comprising the steps of:

producing an X output if any of said responses are absolute X;

producing an X output if a conditional X and an activate conditional X response are present;

producing an output identical to a previous output of said primitive if an output previous state response is present; and producing an ouput identical to the response to the examination of said present data bit and at least one present Z bit if none of the above occur.

* * * * *